United States Patent  
Treharne et al.

(10) Patent No.: US 12,210,063 B1
(45) Date of Patent: Jan. 28, 2025

(54) BATTERY WATCHDOG (71) Applicant: ATCDT Corp., Farmington Hills, MI (US)

(72) Inventors: Jason Treharne, Llanelli (GB); Greg Heald, Oklahoma City, OK (US)

(73) Assignee: ATCDT Corp., Farmington Hills, MI (US)

( * ) Notice: Subject to any disclaimer, the term of this patent is extended or adjusted under 35 U.S.C. 154(b) by 0 days.

(21) Appl. No.: 18/379,761

(22) Filed: Oct. 13, 2023

(51) Int. Cl.
*G01R 31/367* (2019.01)
*G01R 31/396* (2019.01)
*G06F 1/3212* (2019.01)

(52) U.S. Cl.
CPC ......... *G01R 31/367* (2019.01); *G01R 31/396* (2019.01); *G06F 1/3212* (2013.01)

(58) Field of Classification Search
CPC .... G01R 31/367; G01R 31/396; G06F 1/3212
USPC .......................................................... 702/63
See application file for complete search history.

(56) References Cited

U.S. PATENT DOCUMENTS

| | | | |
|---|---|---|---|
| 6,184,656 | B1 | 2/2001 | Karunasiri et al. |
| 10,017,070 | B2 | 7/2018 | Brochhaus |
| 11,368,033 | B2 | 6/2022 | Baarman et al. |
| 11,605,956 | B2 | 3/2023 | Baarman et al. |
| 11,791,637 | B2 | 10/2023 | Baarman et al. |
| 2004/0004464 | A1 | 1/2004 | Tsukamoto |
| 2006/0222912 | A1 | 10/2006 | Smith |
| 2010/0060434 | A1 | 3/2010 | Shiotsu et al. |
| 2010/0256481 | A1 | 10/2010 | Mareci |
| 2011/0184575 | A1 | 7/2011 | Kawamoto et al. |
| 2011/0260687 | A1 | 10/2011 | Kudo et al. |
| 2011/0285347 | A1 | 11/2011 | Chen |

(Continued)

FOREIGN PATENT DOCUMENTS

| | | |
|---|---|---|
| EP | 2 642 574 | 9/2013 |
| EP | 2 985 854 | 2/2016 |

(Continued)

OTHER PUBLICATIONS

U.S. Appl. No. 18/223,578, filed Jul. 19, 2023.

*Primary Examiner* — Ricky Go
(74) *Attorney, Agent, or Firm* — Warner Norcross + Judd LLP (57) ABSTRACT

The present disclosure provides a battery watchdog system for monitoring and managing batteries during short or extended storage and transit while ensuring low drain on a client battery being monitored. The battery watchdog system periodically powers the battery management system (BMS) of the client battery to retrieve battery information. The battery watchdog system can also collect battery information from other sensors (e.g., motion, ambient temperature, humidity, current, voltage, data integrity, and global positioning). The system can integrate data from the client battery and its own sensors to exploit algorithms and assess the battery's state, ambient conditions, potential hazards, and adherence to specific storage or transportation conditions. Further, the battery watchdog system can come equipped with onboard visual and audible indicators. And, in case of hazardous conditions, the system can autonomously activate its indicators to alert personnel.

28 Claims, 7 Drawing Sheets

(56) References Cited

U.S. PATENT DOCUMENTS

| | | | |
|---|---|---|---|
| 2013/0108898 A1* | 5/2013 | Potts | H01M 10/4207 429/61 |
| 2013/0135084 A1 | 5/2013 | Chakravarty | |
| 2013/0271072 A1* | 10/2013 | Lee | H01M 10/4207 320/108 |
| 2014/0225620 A1 | 8/2014 | Campbell et al. | |
| 2014/0266779 A1 | 9/2014 | Grothaus et al. | |
| 2015/0015192 A1 | 1/2015 | Leabman et al. | |
| 2015/0130979 A1 | 5/2015 | Huang | |
| 2016/0099585 A1* | 4/2016 | Song | H02J 7/0068 320/128 |
| 2016/0133063 A1 | 5/2016 | Lim et al. | |
| 2017/0144562 A1 | 5/2017 | Thomas et al. | |
| 2018/0026255 A1 | 1/2018 | Hellenthal et al. | |
| 2019/0033385 A1* | 1/2019 | Karner | H01M 10/06 |
| 2022/0082627 A1* | 3/2022 | O'Mahony | G01R 31/389 |
| 2022/0404426 A1* | 12/2022 | Karner | H01M 10/482 |
| 2023/0019408 A1 | 1/2023 | Baarman et al. | |
| 2023/0314519 A1* | 10/2023 | Yoo | G01R 31/382 |

FOREIGN PATENT DOCUMENTS

| | | |
|---|---|---|
| EP | 3 196 808 | 7/2017 |
| JP | 2011-036106 | 2/2011 |
| JP | 2012-124141 | 6/2012 |
| JP | 2017-034686 | 2/2017 |
| KR | 10-2010-0017735 | 2/2010 |
| KR | 10-2011-0034147 | 4/2011 |
| KR | 10-2014-0082960 | 7/2014 |
| KR | 10-2015-0054632 | 5/2015 |
| KR | 10-2015-0132353 | 11/2015 |
| KR | 10-2017-0028644 | 3/2017 |
| WO | 2013/055479 | 4/2013 |
| WO | 2014/167889 | 2/2017 |
| WO | 2017/036935 | 3/2017 |
| WO | 2019/028451 | 2/2019 |

* cited by examiner

BATTERY WATCHDOG

BACKGROUND OF THE INVENTION

The present invention relates to monitoring a client battery during storage.

Modern batteries often come equipped with battery management systems that enable sophisticated monitoring during operation while installed in a target device. A battery management system (BMS) often manages a rechargeable battery (e.g., cell or battery pack) to protect it from operating outside its safe operating range. A BMS can monitor the state of the client battery, calculating various battery information based on internal sensors, and reporting that data, typically over a Controller Area Network (CAN) interface. For example, a BMS may monitor the state of the battery as represented by various sensed and/or derived characteristics such as voltage, state of charge, state of health, state of power, state of safety, charge current limit, discharge current limit, energy delivered since last charge, internal impedance of a cell, charge delivered to stored, total operating time since first use, and total number of cycles to name a few examples.

However, battery management systems require power and active communication (e.g., Controller Area Network (CAN) communication with a vehicle controller) to operate. During storage (e.g., in a cargo area of a transport vehicle or a cargo area of a warehouse), the battery management system integrated within a client battery is generally non-operational because there is no CAN connection to a controller that controls operation of the BMS and no power is generally supplied to the BMS (typically, the BMS is not powered by the client battery itself, but rather a separate power source when installed within a target device, such as a vehicle).

Efficiently storing and transporting batteries involves compliance with specific environmental conditions to maintain their chemistry, contact material, and chassis over prolonged periods. Disregarding these conditions can lead to battery degradation and pose safety risks, such as thermal runaway, or pose extreme hazards when charging after storage or transit. Existing monitoring systems may either drain the client battery or neglect environmental monitoring, resulting in reduced battery lifespan and unreliable data collection. A system that can address these issues without comprising battery performance is needed.

SUMMARY OF THE INVENTION

The battery watchdog system of the present disclosure provides an advanced battery monitoring system, purpose-built for periodic data acquisition from one or more batteries during client battery storage (e.g., at a storage area in a warehouse or transportation vehicle). Its built-in power supply ensures portability and the ability to accompany the battery for extended periods, many years if needed. Periodic powering of the client battery's battery management system (BMS) enables the retrieval of client battery information, including open circuit voltage, internal temperature, cell temperatures, and other pertinent client battery parameters. Seamless communication with diverse data transmission protocols, such as CAN, SCP, DOIP, and more, facilitates data transfer to a central server or local receiver, allowing technicians, operators, or supervisors to access and analyze the information remote from the client battery.

To assess the state of the client battery and ensure compliance with storage requirements, the battery watchdog system can utilize algorithms, integrating data from its own sensors, which can include accelerometer, humidity, and temperature sensors. Factors like self-discharge rate and external temperature limits can be considered, allowing the system to evaluate the battery's condition and promptly notify relevant personnel of any detected discrepancies or potential hazards.

The present invention provides a battery watchdog unit for monitoring a client battery during storage. The battery watchdog unit can include a housing and an attachment interface for removably physically coupling the unit to the client battery during storage. The watchdog unit can include a power supply for selectively supplying power to a battery management system of the client battery and a communication interface (e.g., CAN interface) for facilitating communication with the battery management system. A watchdog unit wireless communication module can facilitate communication of collected battery information during client battery storage to a remote server. The watchdog unit can also include one or more sensors and a controller that facilitates collection of battery information from the one or more sensors (e.g., battery environmental information such as ambient temperature information, global position system information, humidity, and accelerometer information) as well as collection of battery information from the client battery management system (e.g., temperature, voltage, and current information from general purpose input output (GPIO) pins or from CAN data packets). The watchdog unit can include a battery watchdog power source (e.g., a portable power source such as a battery or a connection to wall power or an external power source). The power source can power the electrical components of the battery watchdog unit.

The battery watchdog controller can be configured or programmed to selectively power the power supply to selectively supply power to the battery management system of the client battery during client battery storage, receive battery information from the battery management system of the client battery during client battery storage via the communication interface, receive battery information including environmental client battery information from the one or more battery watchdog sensors during client battery storage, store the received client battery information in memory, and communicate the battery information to a remote device via the wireless communication module.

In one embodiment, the communication interface can include a Controller Area Network (CAN) interface for receiving battery information including a client battery identifier associated with the client battery.

In one embodiment, the one or more sensors includes a global positioning system for sensing location information. The battery watchdog unit controller is configured or programmed to receive location information from the global positioning system, associate timestamps with the location information, and store the location information with the associated timestamps in memory.

In one embodiment, the one or more sensors includes a thermocouple system for sensing ambient temperature information during client battery storage. The battery watchdog controller is configured or programmed to receive ambient temperature information from the thermocouple system, associate timestamps with the ambient temperature information, and store the ambient temperature information with the associated timestamps in memory.

In one embodiment, the one or more sensors includes an accelerometer for sensing accelerometer information associated with the battery watchdog unit and physically coupled client battery during client battery storage. The battery watchdog controller is configured or programmed to receive accelerometer information from the accelerometer, associate timestamps with the accelerometer information, and store the accelerometer information with the associated timestamps in memory.

In one embodiment, the battery watchdog controller is configured or programmed to receive battery watchdog subsystem information from the one or more sensors, associate battery watchdog timestamps with the battery watchdog subsystem information, and store the battery watchdog subsystem information with the associated timestamps in memory. The battery watchdog controller can be configured or programmed to associate timestamps with the received client battery information and store the received client battery information with the associated timestamps in memory. The received client battery information can include client battery timestamps and the battery watchdog controller can be configured or programmed to associate the battery watchdog subsystem information and the client battery information using the battery watchdog subsystem timestamps and the client battery timestamps, and store the battery watchdog subsystem information, client battery information, and at least one of the battery watchdog subsystem timestamp and the client battery timestamp in memory.

In one embodiment, the battery watchdog unit includes a user interface that includes a speaker, a display, and one or more status lights. In some embodiments, the user interface is configured to receive location information indicative of a physical location within a cargo area where the client battery is located.

The present disclosure also provides a battery watchdog system for monitoring multiple client batteries being stored in a cargo area. The system can include multiple battery watchdog units that physically couple to different client batteries. Each of the battery watchdog units can be as described above with a controller that receives some battery information from the battery management system of the client battery via the communication interface and some battery information from one or more battery watchdog sensors. That battery information can be communicated to a remote device over a network via a wireless communication module.

In one embodiment, the battery watchdog system can include battery identifier indicia disposed on and associated with the client batteries, each battery ID indicia being indicative of a client battery ID for the associated client battery. The battery watchdog system cargo area can include one or more racks for storing client batteries. The rack can include multiple client battery storage locations each associated with a location ID. At each client battery storage location a location ID indicia can be disposed that is indicative of that physical location within a cargo area.

In one embodiment, each battery watchdog unit includes a data entry device configured to receive and communicate a client battery identifier and battery location to the battery watchdog controller. In one embodiment, the battery watchdog system can include a scanning device that is configured to scan the battery identifier indicia and the battery location indicia, and communicate battery identifier information and battery location information to the battery watchdog controller. In one embodiment, the battery watchdog system can include an RFID interrogation device that is that is configured to interrogate the battery identifier indicia and battery location indicia in the form of RFID tags, and communicate battery identifier information and battery location information to the battery watchdog controller.

The battery watchdog unit, system, and associated methods provide effective and efficient client battery monitoring during storage without compromising client battery performance.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DESCRIPTION OF THE CURRENT EMBODIMENT

Figure 1:
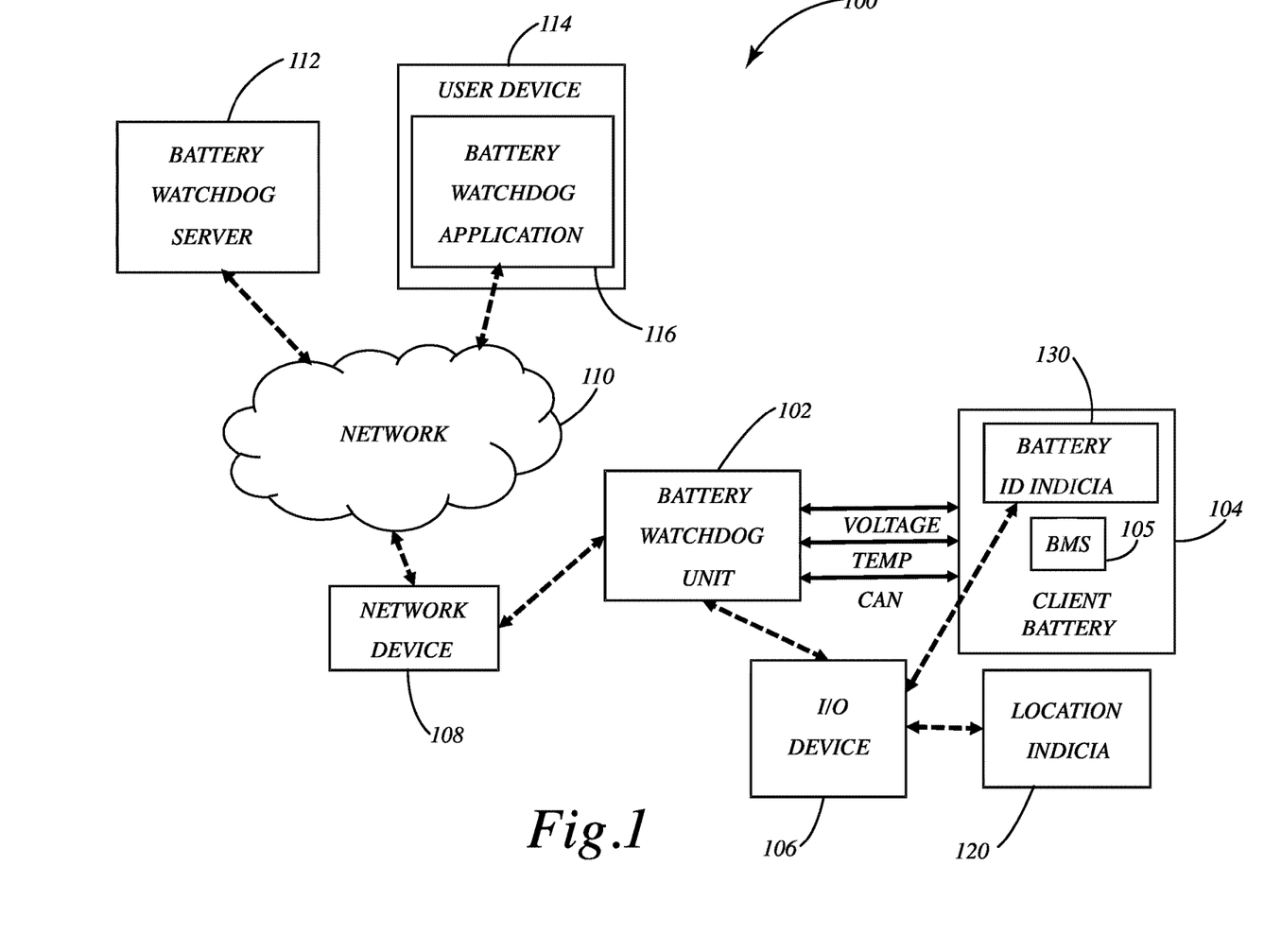
FIG. 1 illustrates an exemplary representative block diagram of a battery watchdog system in accordance with the present disclosure.

The present disclosure relates to a battery watchdog system 100, an exemplary embodiment being depicted in FIG. 1. In general, the battery watchdog system 100 includes a battery watchdog unit 102 that can monitor a client battery 104 by facilitating operation of and collecting battery information for storage in watchdog unit 102 memory from an integrated battery management system (BMS) 105 of a client battery 104. The battery watchdog unit 102 can include its own sensors (e.g., accelerometer, thermocouple, and/or global positioning system) that can collect and store additional battery information along with the battery information collected from the integrated BMS.

Figure 8:
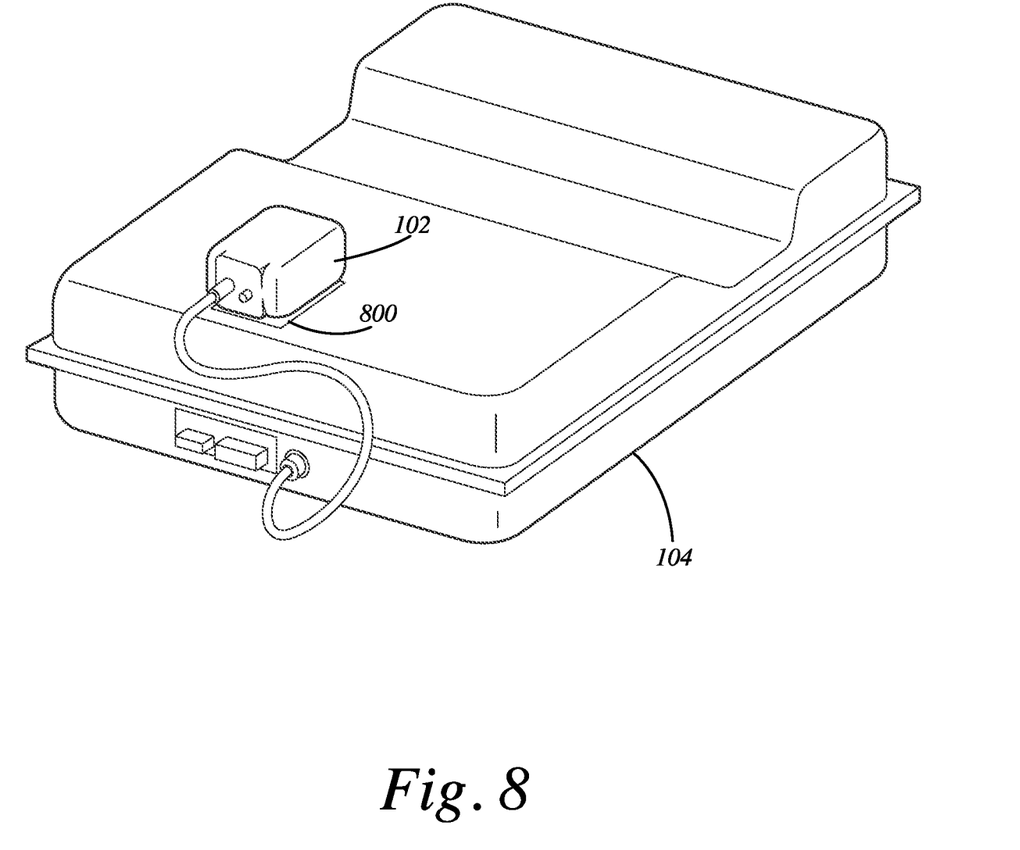
FIG. 8 illustrates an exemplary battery watchdog unit physically mounted to a client battery.

FIG. 8 illustrates an exemplary battery watchdog unit 102 electrically coupled to a client battery 104 by wire. In alternative embodiments, a wireless connection between the battery watchdog unit 102 and the client battery 104 can be utilized. In addition, FIG. 8 illustrates a battery watchdog unit attachment interface 800 for removably physically coupling the battery watchdog unit 102 to the client battery 104. The battery watchdog unit attachment interface 800 can include hook and loop fastener surfaces (e.g., on the surface of the battery watchdog unit and the client battery housing), double-stick tape, a pouch, fasteners (e.g., screws or bolts), or another interface for retaining the battery watchdog unit with the client battery.

The battery watchdog system 100 can also include an input/output (I/O) device 106. The I/O device can be a scanner, keypad, touch screen, or essentially any other data entry or user interface device. The I/O device 106 can facilitate provisioning a battery watchdog unit 102 for use with a particular client battery 104 that has an associated battery identifier 130 and that is located at a particular location associated with a location identifier 120.

In one embodiment, the I/O device 106 can be a scanner that can be used by a provisioner to scan client battery ID indicia 130 and location ID indicia 120. The client battery 104 can include a client battery ID indicia 130 that displays the client battery ID. In the storage area the location ID indicia 120 can be disposed and associated with each location where a client battery 104 can be located during storage. In operation, a provisioner scans a client battery ID indicia 130 to obtain the client battery ID and scans a location ID indicia 120 to obtain the location ID where the client battery is currently located (e.g., floor, rack, row/column etc.). The scanner communicates that ID information to the battery watchdog unit 102 associated with the client battery 104 (e.g., the client battery 104 electrically connected via CAN cable and potentially other cables, such as voltage and temperature cabling as depicted in FIG. 1). This ID information, when combined with the other battery information collected by the battery watchdog unit 102 enables battery information tracking of a client battery 104 during storage that is associated with a particular client battery identifiable by client battery ID and location ID. The battery information (e.g., including ID information, BMS information, and watchdog unit information) can include timestamp data associated with some or all of the battery information to facilitate tracking the status of the client battery over time.

In alternative embodiments, instead of the I/O device 106 being a scanner that scans client battery indicia and location indicia, the I/O device 106 can be an RFID interrogation device. In such an embodiment, the client battery ID indicia and location ID indicia can be RFID tags. That is, each client battery can include an RFID tag with memory having the associated client battery ID and each location can have an RFID tag at or near the location with memory having an associated location ID.

Figure 2:
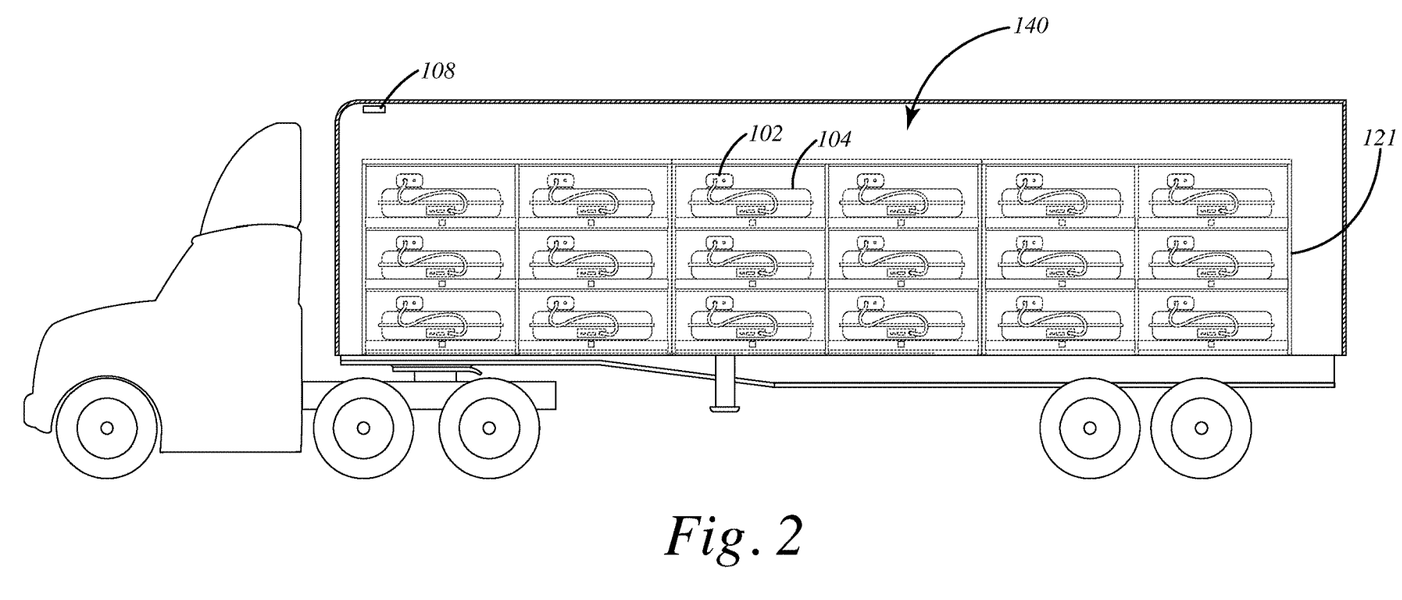
FIG. 2 illustrates an exemplary battery storage area for use in connection with a battery watchdog system of the present disclosure.
Figure 3:
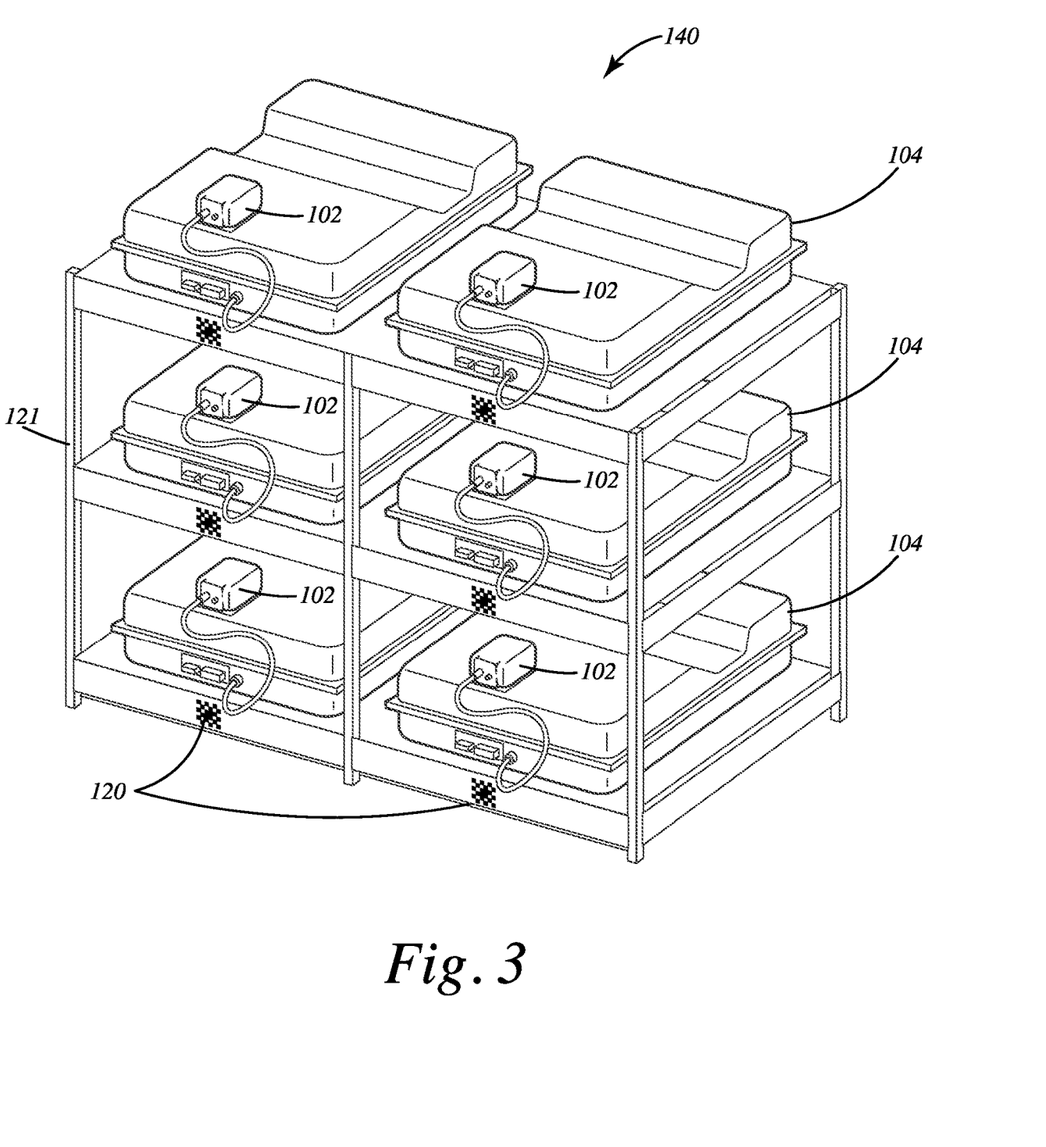
FIG. 3 illustrates another exemplary battery storage area for use in connection with a battery watchdog system of the present disclosure.

The battery watchdog system of the present disclosure is configured for monitoring one or more client batteries during storage. Exemplary storage areas are depicted in FIGS. 2-3. An exemplary client battery storage area 140 is illustrated in FIG. 2. This exemplary storage area 140 is at a warehouse where batteries can be held temporarily (e.g., after manufacture, but before being sold to a customer, or an intermediary facility, such as a distribution warehouse). The storage area 140 can include multiple racks that each can hold multiple client batteries 104 each having an associated battery watchdog unit 102. The battery watchdog units can be installed in the storage area for removable connection to provisioned client batteries, installed in the racks (disposed within the storage area), or temporarily mounted to the client batteries.

In the FIG. 2 embodiment, the batteries are arranged on a set of racks and the battery watchdog units are arranged on a different set of racks. Each battery is electrically coupled (e.g., via a CAN cable) to a battery watchdog unit in a corresponding location in another rack. In this way, the battery watchdog units can be permanently installed in the storage area, and as batteries are brought to or taken from the storage area they can be electrically coupled to a battery watchdog unit for monitoring the battery at a corresponding location.

Different location ID indicia 120 can be disposed on each rack at each location where a battery can be stored. Each location ID indicia 120 can be associated with a location ID that is associated with a different physical location on a storage rack 121 (e.g., rack number, row, and column). In this way, a location ID 120 can be used to direct a user to a particular location (e.g., rack, row, and column). Alternatively, in another embodiment, one location ID indicia is provided for each rack—which can be used to direct a user to a particular rack. The user can identify a specific battery on the rack by warning lights or warning audio of the electrically coupled battery watchdog unit.

Another exemplary client battery storage area 141 is illustrated in FIG. 3 as the payload of a transportation vehicle. The FIG. 3 storage area 141 is a cargo area of a truck where batteries can be held temporarily during transportation (e.g., when being transported from a manufacturing facility to a distribution warehouse or being transported from a distribution warehouse to an assembly facility or point of sale). Just as with FIG. 2, the storage area 140 of FIG. 3 can include multiple racks that each can hold multiple client batteries, each with their own associated battery watchdog unit. The battery watchdog units can be installed in the vehicle for removable connection to provisioned client batteries, installed in a battery watchdog rack (disposed within the vehicle), or temporarily mounted to the client batteries.

Location ID indicia 120 are disposed on each rack at each location where a battery can be stored. Each location ID indicia 120 can be included with a location ID that is associated with a vehicle/payload, storage rack, and a different physical location within that storage rack (e.g., row and column). In this way, a location ID can be used to identify (and therefore direct a user to) a particular location (e.g., vehicle, rack, row, and column). In other embodiments, one location ID indicia is provided for each rack—which can be used to identify a particular rack and the battery watchdog unit can self-identify (e.g., by warning lights or warning audio) for a user near the rack.

Referring to FIGS. 1-3, the storage area 140, 141 can include a network device 108 for facilitating communication over a network 110 to a battery watchdog server 112 or battery watchdog application 116 on a user device 114. The battery watchdog unit 102 can communication battery information (e.g., ID information received from the I/O device 106, battery watchdog unit sensor information, client battery BMS information, and timestamps) to one or more battery watchdog servers 112 and/or user devices 114. The battery information can be communicated over a network 110. A hub, cellular router, WiFi router, or other network device 108 can facilitate communication from the battery watchdog unit 102 to the server(s) 112 and/or user device(s). A battery watchdog application 116 on the user device can provide live (e.g., real-time or near real-time) and/or logged updates about the status of the client battery 104.

In this way, battery information such as battery characteristics (e.g., temperature, voltage, and/or current) can be tracked and correlated with output from watchdog sensors (e.g., accelerometer, humidity, thermocouple, and GPS) for individual client batteries based on timestamps along with client battery IDs and location IDs. The battery information can provide a watchdog history during battery storage and/or transit that is otherwise unavailable. For example, if a client battery is jostled, dropped, moved from its provisioned location, or drained below a pre-determined level the collected battery information allows a user, via a battery watchdog application 116 on a user device 114, to track such changes live as they occur and/or to have a historical record of the sequence of events. Further, because timestamped battery information is collected from the client battery BMS and watchdog sensors, correlations between the information can be automatically analyzed by the battery watchdog unit, battery watchdog server, and/or battery watchdog application to determine and report various battery events to the user.

Figure 5:
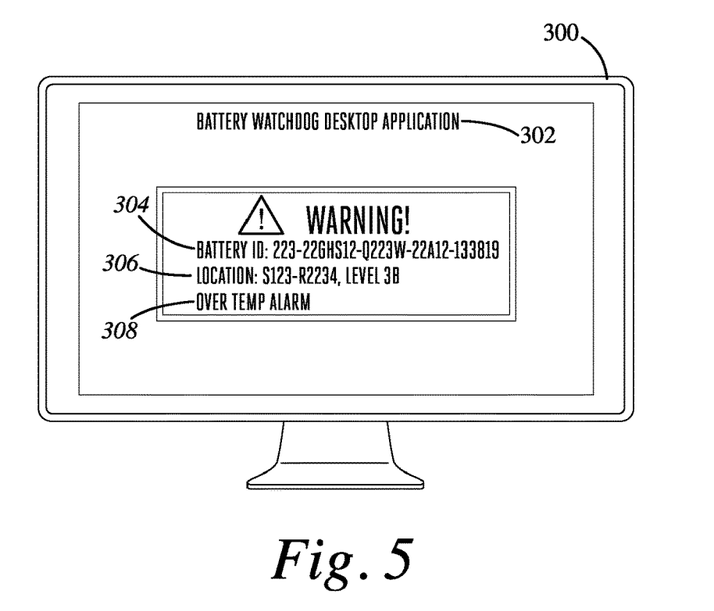
FIG. 5 illustrates an exemplary view of an over-temperature alarm for a particular battery at a particular location on a monitor displaying a battery watchdog desktop application.
Figure 6:
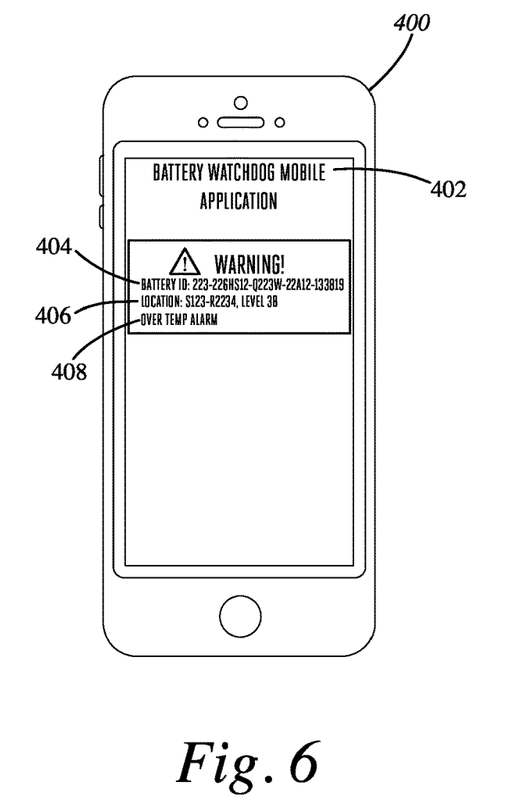
FIG. 6 illustrates an exemplary view of an over-temperature alarm for a particular battery at a particular location on a smart phone displaying a battery watchdog smartphone application.

For example, as shown in FIGS. 5-6, an over-temperature alarm notification 308, 408 can be sent to a battery watchdog desktop application 302 running on a desktop computer 300 or battery watchdog mobile application 402 running on a smartphone or other mobile device 400. The alarm 308, 408 can include information identifying the specific client battery subject to the warning based on the client battery ID (e.g., as depicted in FIGS. 5 and 6 the warning can include the client battery ID 304, 404). The alarm can also include information identifying the provisioned location (e.g., as depicted in FIGS. 5 and 6 the warning can include the location ID 306, 406) of the battery. Additional notifications and/or alarms can be provided to the user. For example, in battery watchdog systems that include a global positioning system (GPS), the location of the battery can be monitored. If any issue arises in a storage area for a battery, a warning may be communicated to warn users regarding the potential issue and encouraging caution before accessing the storage area.

Integrated BMSs are typically non-functional during battery storage by design. They provide battery management functionality once installed in a target device where they can be controlled by a target device system (e.g., a charger, a load, a thermal management system, and/or an emergency shutdown system). The battery watchdog systems of the present disclosure can communicate with and enable a battery management system at times where it is not being controlled by a target device system, e.g., during client battery storage in a storage area. That is, where the client battery is not installed in a target device (e.g., where the client battery is an electric vehicle battery—where the electric vehicle battery is not installed as a vehicle battery). The battery watchdog system enables battery monitoring functionality during times when the battery management system is otherwise non-operational.

Providing battery monitoring functionality during storage/transit can provide value for a variety of reasons. For example, the battery watchdog system can ensure that there is low, if any, drain on the client battery being monitored. The battery watchdog system can also monitor battery voltage, battery current, battery temperature, and other battery information about the client battery. Such information can be stored locally in memory on a battery watchdog unit and/or communicated (e.g., wirelessly via a network device 108 (e.g., a router, hub, switch) to a battery watchdog cloud server 112 and/or battery watchdog application 116 on a user device 114).

Figure 4:
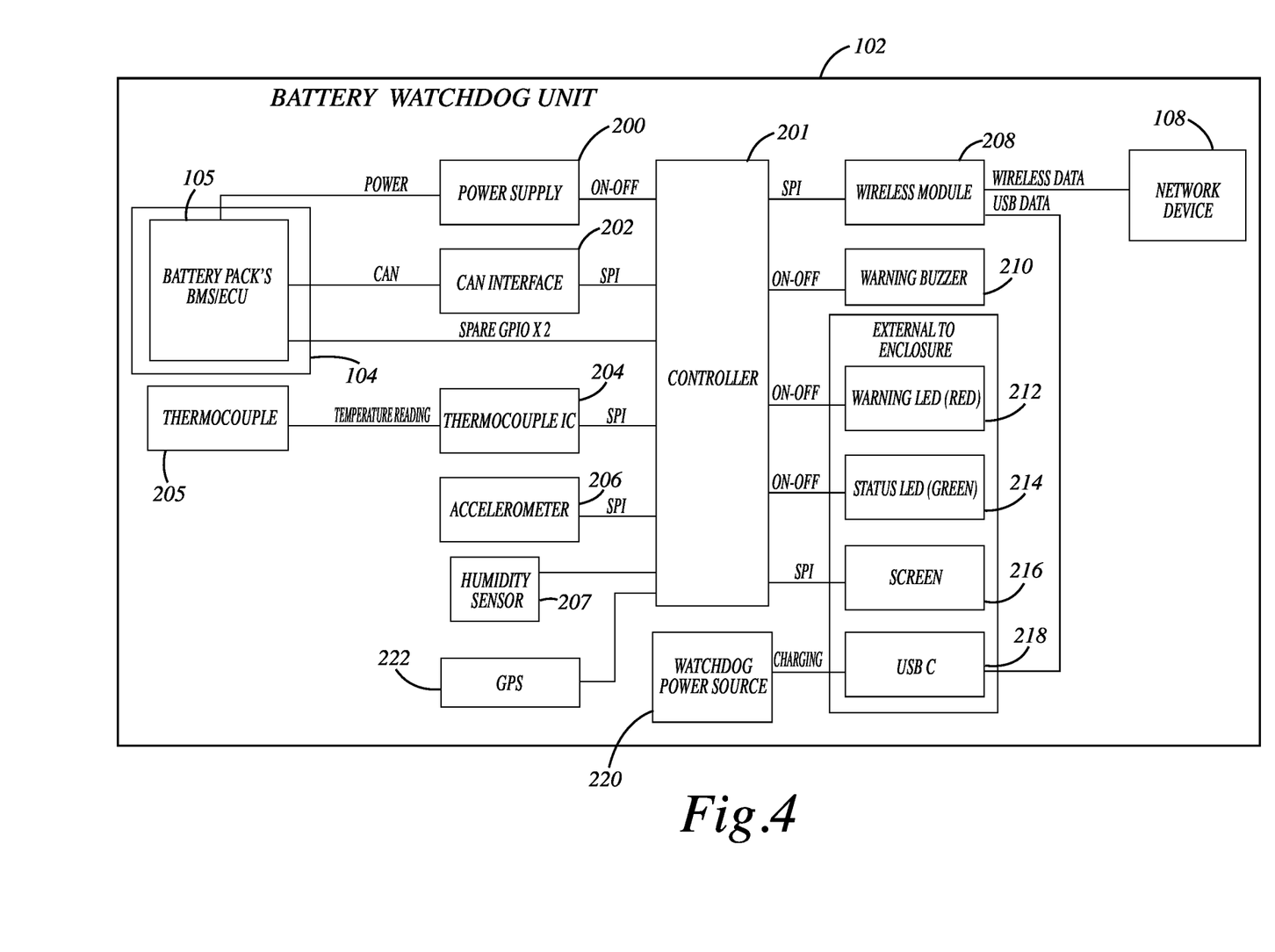
FIG. 4 illustrates an exemplary representative block diagram of a battery watchdog unit with connections to a client battery, thermocouple, and router.

FIG. 4 illustrates a representative block diagram of a battery watchdog unit 102 in accordance with the present disclosure. The battery watchdog unit 102 includes a controller 201 that controls the various components of the battery watchdog unit 102 according to programmed instructions. The controller can be a peripheral interface controller ("PIC") or essentially any other type of controller suitable for control of the various battery watchdog components. The controller 201 can include memory (e.g., non-volatile program memory, electronically erasable programmable read-only memory (EEPROM), and/or random access memory (RAM)). The controller memory can be used to store machine instructions that the controller can execute as well as battery information. In some embodiments, battery information may be stored locally on the controller (e.g., a day or week worth of battery information) with older data being replaced with newer data. Instead or in addition, additional memory, external from the controller, can be provided for storing battery information.

The battery watchdog unit 102 can include a power supply 200. The power supply 200 can be selectively enabled by the controller 201 to selectively provide power sufficient to operate the battery management system (even while not installed within a target device). In the current embodiment, the power supply is a 12V power supply. In alternative embodiments, the power supply can provide a different voltage level. The power supply 200 can selectively draw power from the watchdog power source 220 without power draw (e.g., quiescent power draw) from the client battery.

The battery watchdog unit can include a communication interface 202. The communication interface 202 can facilitate communication between the controller 201 and the battery management system 105 of the client battery 104. In the current embodiment, the communication interface 202 is a Controller Area Network (CAN) interface that can facilitate communication between a CAN device (e.g., a battery management system) and a serial peripheral interface (SPI) device (e.g., a microcontroller). The communication interface 202 can receive CAN communication from the battery management system and convert such communication into serial peripheral interface protocol messages that can be received and understood by the controller 201. The communication interface 202 can receive SPI protocol messages from the controller 201 and convert them to CAN messages that can be communicated and understood by the battery management system 105. Although the current embodiment utilizes a CAN interface, other embodiments can utilize other data transmission protocols such as Secure Copy Protocol (SCP), Diagnostics Over Internet Protocol (DOIP), or essentially any other suitable communication protocol.

Referring to FIG. 4, the battery watchdog unit 102 can include additional sensor components to collect additional sensor data that can be especially useful while monitoring during battery storage. The battery watchdog unit 102 can include additional sensor components such as an accelerometer 206, a thermocouple system (including thermocouple IC 204 and thermocouple 205), humidity sensor 207 and/or a global positioning system 222 to name a few examples. These additional sensor components can provide additional battery information not otherwise available from the integrated battery management system 105. For example, the accelerometer 206 can provide acceleration data, such as raw acceleration data, orientation data, vibration/motion data, impact/shock data, activity tracking data, tilt/level data, and free fall data. The thermocouple system (204, 205) can provide thermocouple data, such as ambient temperature readings and/or client battery enclosure temperature readings depending on how and where the thermocouple is configured (e.g., the thermocouple can be placed in direct contact with a client battery surface to sense its surface temperature or within the general ambient airflow to sense ambient temperature readings). By including these components in the battery watchdog unit, the additional sensor data can be collected during storage where such information can be especially useful. Further, because the components reside in the battery watchdog unit, they do not clutter the integrated battery management system of the client battery with additional components that collect unnecessary information or stand idle while the client battery is installed in a target device. Similarly, other battery watchdog components, such as a display, warning light(s), status light(s), warning buzzer, and a wireless communication module to name a few, can be included in the battery watchdog unit to provide extra functionality that can be especially useful during battery transmit/storage, but that may be duplicative or unnecessary once the client battery is installed in the target device.

Each of the monitored batteries can be referred to as a client battery. The battery watchdog system incorporates an inbuilt power supply, enabling portability and the ability to remain with the client battery for extended periods. The battery watchdog system periodically powers the Battery Management System (BMS) of each client battery to retrieve vital information while offering versatile communication options (e.g., using one or more data transmission protocols, such as Controller Area Network (CAN), Secure Copy Protocol (SCP), Diagnostics Over Internet Protocol (DOIP), or another data transmission protocol). Equipped with sensors for motion, ambient temperature, humidity, current, voltage, data integrity, and GPS, the battery watchdog integrates data from the client battery and its own sensors to exploit algorithms to assess the battery's state, ambient conditions, potential hazards, and adherence to specific storage or transportation requirements. The collected data can be processed locally at the battery watchdog unit and transmitted, both in raw and processed forms, to a central server or local receiver for comprehensive monitoring and further analysis. Furthermore, the battery watchdog can be equipped with onboard visual and audible warning/status indicators, including the option to connect high-power visual and audible warning devices compliant with regulatory standards. In case of hazardous conditions, the battery watchdog unit can act autonomously and activate its onboard/local audio-visual warning components to alert personnel regardless of third-party off-board systems. For example, the battery watchdog unit can include a warning buzzer 210 as well as one or more warning LEDs 212 and one or more status LEDs 214. Further, the battery watchdog unit can include a screen 216 to display information, such as currently provisioned battery ID and location ID.

During operation, the battery watchdog unit may periodically wake (e.g., every 15 or 30 minutes) and check on the status of the client battery by supplying power to the client battery BMS 105 and receiving battery information from the BMS. In parallel during this awake period, the battery watchdog unit can also collect and receive additional battery information from any watchdog sensors (e.g., thermocouple, accelerometer, and humidity sensor) and process any communication received from the user (e.g., via a desktop or mobile application). That is, some sensors may be powered from the battery watchdog power source while the rest of the components are sleeping. During the awake period, the battery watchdog unit can process and send out any appropriate alerts (e.g., by activating a local buzzer, a local light source, and/or communicating to a desktop or mobile user application). For example, if the battery unit accelerometer sensed a predetermined force above a particular threshold, an alert can be triggered to check on the physical status of the battery. As another example, the user interface of the desktop or mobile application can provide a find client battery feature. This feature can include a user interface element that when activated will send communication to the battery watchdog unit to activate its buzzer and/or light, which will allow the user to quickly identify the subject client battery. As another example, this feature can be automated where if the battery watchdog unit determines there is potentially an issue (e.g., sensed value or combination of sensed values outside a particular acceptable range) then its buzzer and/or light can be activated to bring attention to the client battery. In addition, the battery watchdog unit can send a notification to the user via desktop and/or mobile application to prompt them to investigate. These alerts can also be conditioned on a set of battery watchdog safety conditions. For example, if a battery has entered thermal runaway or some other potentially unsafe condition has occurred or the battery watchdog unit determines may occur, the alert system can provide that information so that the user knows there is an issue and not to physically investigate the client battery without the proper precautions and equipment.

The battery watchdog unit can include its own watchdog power source 220. In the current embodiment, the battery watchdog unit includes 21700 modules x2 (series) with a 7.4V nominal voltage. Alternatively or additionally, the power source can include a power input for connection to wall power or another external power source. The power source 220 can connect via a USB-C connection and USB data can be communicated to the wireless module 208.

In addition to its monitoring capabilities, the battery watchdog system can be equipped with sensors to detect motion, temperature changes, and internal current variations. These features enable the system to identify instances of battery mishandling, such as drops or jolts. Consequently, the battery watchdog system can trigger inspections to safeguard the integrity and performance of the client battery during storage. These triggers (and associated tolerances) can vary depending on the particular storage environment. For example, accelerometer triggers and tolerances may be lower where the client battery is stored within a warehouse storage area as opposed to where the client battery is stored in a transpiration vehicle storage area.

Figure 7:
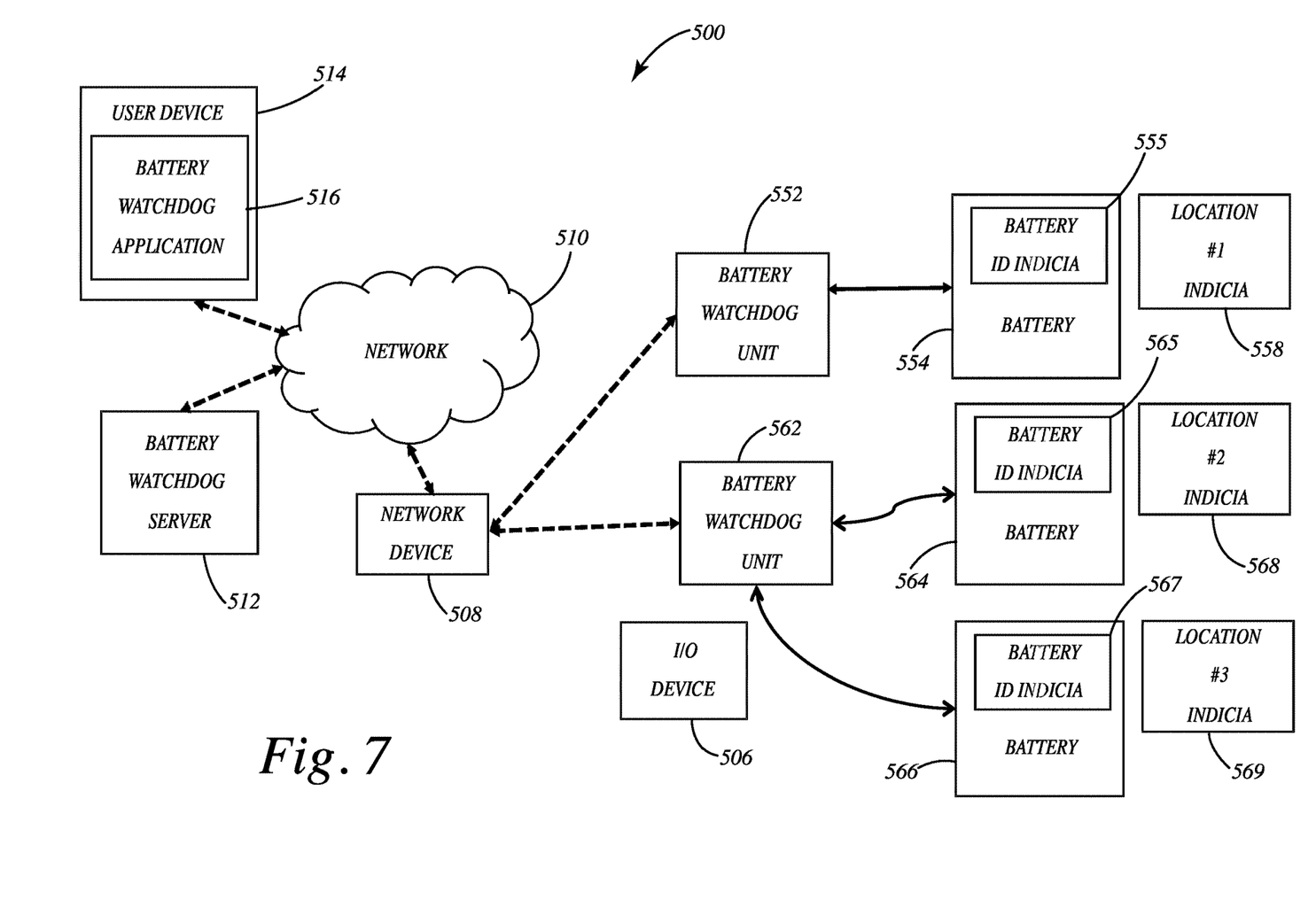
FIG. 7 illustrates another exemplary representative block diagram of a battery watchdog system in accordance with the present disclosure.

In some embodiments, one battery watchdog unit can monitor multiple client batteries as depicted in the exemplary battery watchdog system 500 of FIG. 7. In this example, one battery watchdog unit 552 is similar to that as described above in that it has a CAN connection to a client battery 554 with its own battery management system. When provisioned, the I/O device 506 can be utilized to scan battery ID indicia 555 and location #1 indicia 558 to associate that client battery with that particular location and that battery watchdog unit 552. Another battery watchdog unit 562 includes multiple CAN connections to the battery management systems of client batteries 564, 566. When provisioning these client batteries 564, 566, the battery ID indicia 565,567 and location indicia 568, 569 can be scanned and the appropriate battery IDs can be associated with the appropriate location IDs and the particular CAN interfaces in that battery watchdog unit 562. This allows one battery watchdog unit to leverage its environmental sensors to collect environmental battery data and utilize that data in conjunction with both batteries. For example ambient temperature readings from one battery watchdog unit can be utilized with the battery management system battery information collected from both batteries 565, 567.

Further, in some embodiments, both client batteries can be physically mounted to the same battery watchdog unit 562 (e.g., via Velcro, double-stick tape, or a pouch configuration). In this way, accelerometer data registered due to changes in acceleration of the battery watchdog unit 562 can be imputed to both of the client batteries 565, 567. In other embodiments, instead of being physically coupled together, the battery watchdog unit 562, and the two client batteries may be situated in the same general vicinity (e.g., such as on the same rack) such that were the battery watchdog unit accelerometer subjected to acceleration forces, those forces could be reasonably imputed to the client batteries being monitored (e.g., should the rack be jostled or tipped over, the battery watchdog unit can treat that environmental battery information as environmental battery information for both client batteries). The same logic applies to the global positioning system or other battery watchdog unit sensor subsystems.

While the accelerometer, thermocouple IC and the GPS battery watchdog subsystems are internal sensors to the battery watchdog unit, in some embodiments, a battery watchdog sensor subsystem can be provided external to the battery watchdog unit and leveraged by multiple battery watchdog units in the general area. For example, a standalone temperature sensor unit can be installed within the storage area and configured to periodically communicate ambient temperature readings to the battery watchdog units (or directly to a nearby network device for later association with collected battery information from the battery watchdog units). In this way, one standalone temperature sensor system can serve multiple battery watchdog units without the need to provide that sensor system within each unit. As another example, some storage areas may come equipped with a fan unit. The speed and operation of such a fan unit may constitute battery information relevant to the airflow within the battery storage area that may be pertinent to the overall battery information collected. Again, multiple battery watchdog units may leverage this fan information without each having its own fan/cooling system.

The battery watchdog systems of the present disclosure introduce innovative solutions for comprehensive battery monitoring during short or extended storage (e.g., storage in a warehouse or storage during transit in a vehicle), ensuring the preservation of the client battery performance while reducing power consumption. By incorporating an inbuilt power supply and a diverse sensor suite, the battery watchdog system can provide live (e.g., real-time, near-real time, or historic record) battery data on battery health, adherence to battery storage conditions, and potential battery associated hazards. With its advanced monitoring and warning features, the battery watchdog system is a reliable and efficient tool for extending battery lifespan and mitigating operational risks during battery storage and battery transit.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A battery watchdog unit for monitoring a client battery during client battery storage, the client battery having a battery management system, the battery watchdog unit comprising:

a battery watchdog power supply for selectively supplying power to the battery management system integrated within the client battery during client battery storage where the client battery is not installed in a target device;

a communication interface for receiving battery information from the battery management system of the client battery during client battery storage;

one or more battery watchdog sensors for sensing battery information including environmental battery information;

a wireless communication module for communicating, to a remote device, battery information, including battery information received from the battery management system of the client battery and environmental battery information from the one or more battery watchdog sensors, collected during client battery storage;

a battery watchdog controller;

a battery watchdog power source for powering electrical components of the battery watchdog unit, including the battery watchdog power supply, the communication interface, the wireless communication module, and the battery watchdog controller; and wherein the battery watchdog controller is configured or programmed to:
- selectively power the battery watchdog power supply to selectively supply power to the battery management system of the client battery during client battery storage;
- receive battery information from the battery management system of the client battery during client battery storage via the communication interface;
- receive battery information including environmental battery information from the one or more battery watchdog sensors during client battery storage;
- store the received battery information in memory; and
- communicate the battery information to a remote device via the wireless communication module.

2. The battery watchdog unit of claim 1 wherein the communication interface includes a Controller Area Network (CAN) interface for receiving battery information including a client battery identifier associated with the client battery.

3. The battery watchdog unit of claim 1 wherein the controller includes a plurality of general purpose input/output (GPIO) interfaces for receiving client battery voltage information and client battery temperature information from the battery management system.

4. The battery watchdog unit of claim 1 including a global positioning system for sensing location information, wherein the battery watchdog controller is configured or programmed to receive location information from the global positioning system, associate timestamps with the location information, and store the location information with the associated timestamps in memory.

5. The battery watchdog unit of claim 1 including a thermocouple system for sensing ambient temperature information during client battery storage, wherein the battery watchdog controller is configured or programmed to receive ambient temperature information from the thermocouple system, associate timestamps with the ambient temperature information, and store the ambient temperature information with the associated timestamps in memory.

6. The battery watchdog unit of claim 1 including a battery watchdog unit attachment interface for removably physically coupling the battery watchdog unit to the client battery, and including an accelerometer for sensing accelerometer information associated with the battery watchdog unit and physically coupled client battery during client battery storage, wherein the battery watchdog controller is configured or programmed to receive accelerometer information from the accelerometer and store the accelerometer information in memory.

7. The battery watchdog unit of claim 6 wherein the battery watchdog controller is configured or programmed to receive accelerometer information from the accelerometer, associate timestamps with the accelerometer information, and store the associated timestamps in memory with the accelerometer information.

8. The battery watchdog unit of claim 1, wherein the battery watchdog controller is configured or programmed to receive battery watchdog subsystem information from the one or more sensors, associate battery watchdog timestamps with the battery watchdog subsystem information, and store the battery watchdog subsystem information with the associated timestamps in memory.

9. The battery watchdog unit of claim 8 wherein the battery watchdog controller is configured or programmed to associate timestamps with the received battery information and store the received battery information with the associated timestamps in memory.

10. The battery watchdog unit of claim 8 wherein the received battery information includes client battery timestamps and wherein the battery watchdog controller is configured or programmed to associate the battery watchdog subsystem information and the battery information using the battery watchdog subsystem timestamps and the client battery timestamps, and store the battery watchdog subsystem information, battery information, and at least one of the battery watchdog subsystem timestamp and the client battery timestamp in memory.

11. The battery watchdog unit of claim 1 including a user interface, wherein the user interface includes a speaker, a display, and one or more lights.

12. The battery watchdog unit of claim 1 including a user interface, wherein the user interface is configured to receive location information indicative of a physical location within a storage area where the client battery is located.

13. The battery watchdog unit of claim 1 wherein the client battery includes a battery identifier indicia, wherein a client battery holding location includes a battery location indicia indicative of a physical location within a client battery storage area, wherein the battery watchdog system includes a scanning device configured to scan the battery identifier indicia and the battery location indicia, and communicate battery identifier information and battery location information to the battery watchdog controller.

14. The battery watchdog unit of claim 1 wherein the client battery is associated with a battery identifier and a client battery holding location is associated with a battery location identifier, wherein the battery watchdog system includes a data entry device configured to receive and communicate the battery identifier and the battery location identifier to the battery watchdog controller.

15. The battery watchdog unit of claim 1 including a battery watchdog unit attachment interface for removably physically coupling the battery watchdog unit to the client battery.

16. The battery watchdog unit of claim 1 wherein the battery watchdog power supply selectively supplies power to the battery management system of the client battery during client battery storage without power draw from the client battery.

17. A battery watchdog system for monitoring a plurality of client batteries during storage, the client batteries each having a battery management system, and a client battery identifier indicia representative of a different client battery ID, the battery watchdog system comprising:

a plurality of battery watchdog units, each of the plurality of battery watchdog units including:
- a power supply for selectively supplying power to and electrically coupled with a battery management system integrated within one of the plurality of client batteries during client battery storage where the plurality of client batteries are not installed in a target device;
- a communication interface for communicating with the electrically coupled battery management system;
- a battery watchdog sensor subsystem configured to sense battery information including environmental battery information;
- a wireless communication module for communicating battery information to a remote device, the battery information being collected from the electrically coupled battery management system and the environmental battery information;

a battery watchdog unit controller configured to:
selectively power the battery watchdog unit power supply to selectively supply power to the electrically coupled battery management system of the client battery;
receive battery information from the electrically coupled battery management system of the client battery and the battery watchdog sensor subsystem;
store the received battery information in memory; and
communicate the battery information to a remote device via the wireless communication module; and a battery watchdog unit power source for powering electrical components of the battery watchdog unit, including the battery watchdog unit power supply, the battery watchdog unit communication interface, the battery watchdog unit wireless communication module, and the battery watchdog unit controller; and a cargo area having a plurality of different client battery storage locations, each client battery storage location being associated with a different location identifier indicia representative of a different location ID, wherein the plurality of client batteries are located in the plurality of different client battery storage locations;

an I/O device configured to facilitate provisioning the plurality of battery watchdog units, based on the different location IDs of the plurality of different client battery storage locations and the different client battery IDs of the plurality of client batteries, for monitoring the plurality of client batteries stored in the plurality of different client battery storage locations in the cargo area.

18. The battery watchdog system of claim 17 wherein each communication interface of the plurality of battery watchdog units includes a Controller Area Network (CAN) interface for receiving battery information including a client battery identifier associated with the client battery.

19. The battery watchdog system of claim 17 wherein each controller of the plurality of battery watchdog units includes a plurality of general purpose input/output (GPIO) interfaces for receiving client battery voltage information and client battery temperature information.

20. The battery watchdog system of claim 17 wherein the battery watchdog sensor subsystem of each battery watchdog unit includes a global positioning system for sensing location information.

21. The battery watchdog system of claim 17 wherein the battery watchdog sensor subsystem of each battery watchdog unit includes a thermocouple system for sensing ambient temperature information.

22. The battery watchdog system of claim 17 wherein the battery watchdog sensor subsystem of each battery watchdog unit includes an accelerometer for sensing accelerometer information.

23. The battery watchdog system of claim 17, wherein the battery watchdog controller of each battery watchdog unit is configured or programmed to associate battery watchdog timestamps with the battery information received from the battery watchdog sensor subsystem, and store the battery information received from the battery watchdog sensor subsystem with the associated timestamps in memory.

24. The battery watchdog system of claim 17 wherein the battery watchdog controller of each battery watchdog unit is configured or programmed to associate timestamps with the received battery information and store the received battery information with the associated timestamps in memory.

25. The battery watchdog system of claim 17 wherein the received battery information includes client battery timestamps and wherein the battery watchdog controller of each battery watchdog unit is configured or programmed to associate the battery information from its battery watchdog sensor subsystem and the client battery information using battery watchdog sensor subsystem timestamps and the client battery timestamps, and store the battery information and at least one of the battery watchdog sensor subsystem timestamp and the client battery timestamp in memory.

26. The battery watchdog system of claim 17 wherein the I/O device includes a scanning device configured to scan the battery identifier indicia and the battery location indicia, and communicate battery identifier information and battery location information to a selected battery watchdog controller.

27. The battery watchdog system of claim 17 wherein the I/O device includes a data entry device configured to receive and communicate the battery identifier and the battery location identifier to a selected battery watchdog controller.

28. The battery watchdog unit of claim 17 wherein each battery watchdog unit includes a battery watchdog unit attachment interface for removably physically coupling the battery watchdog unit to a client battery.

* * * * *